(12) United States Patent
Miyamura et al.

(10) Patent No.: US 7,004,761 B2
(45) Date of Patent: Feb. 28, 2006

(54) DISPLAY APPARATUS AND CONNECTING CABLES USED IN THE DISPLAY APPARATUS

(75) Inventors: Yukiharu Miyamura, Shizuoka-ken (JP); Takashi Inaoka, Shizuoka-ken (JP)

(73) Assignees: Pioneer Corporation, Tokyo (JP); Pioneer Display Products Corporation, Fukuroi (JP)

( * ) Notice: Subject to any disclaimer, the term of this patent is extended or adjusted under 35 U.S.C. 154(b) by 0 days.

(21) Appl. No.: 10/718,695

(22) Filed: Nov. 24, 2003

(65) Prior Publication Data
US 2004/0106306 A1 Jun. 3, 2004

(30) Foreign Application Priority Data
Dec. 2, 2002 (JP) .............................. 2002-349588

(51) Int. Cl.
*H01R 12/00* (2006.01)
(52) U.S. Cl. ....................................................... 439/67
(58) Field of Classification Search ............... 439/67; 349/150; 174/254; 361/749
See application file for complete search history.

(56) References Cited

U.S. PATENT DOCUMENTS

| 4,251,683 | A  | * | 2/1981 | Oughton et al. ........ 174/74 R |
| 6,193,544 | B1 | * | 2/2001 | McGinnis ................ 439/492 |
| 6,201,689 | B1 | * | 3/2001 | Miyasyo .................. 361/681 |
| 6,274,819 | B1 | * | 8/2001 | Li et al. .................. 174/254 |

FOREIGN PATENT DOCUMENTS

JP 2000-150033 5/2000

* cited by examiner

*Primary Examiner*—Phuong Dinh
(74) *Attorney, Agent, or Firm*—McGinn IP Law Group, PLLC (57) ABSTRACT

A display apparatus has: a first connecting terminal CA1 which is provided in a first end portion of a flexible cable CA and electrically connected to an electrode terminal of a display panel through a conductive adhesive; and a second connecting terminal CA2 which is provided in a second end portion of the flexible cable CA and electrically connected to a terminal of a drive circuit board 11 for the display panel through a conductive adhesive; and a connector-coupling port CA3 provided in the second end portion of the flexible cable CA for electric connection to a connector 21A provided on a replacement drive circuit board 21.

8 Claims, 6 Drawing Sheets

DISPLAY APPARATUS AND CONNECTING CABLES USED IN THE DISPLAY APPARATUS

BACKGROUND OF THE INVENTION

1. Field of the Invention

This invention relates to a display apparatus and connecting cables used in the display apparatus for the electrical connection.

The present application claims priority from Japanese Application No. 2002-359588, the disclosure of which is incorporated herein by reference.

2. Description of the Related Art

Some display apparatuses have a flat display panel such as a plasma display panel (hereinafter referred to as "PDP"), a field emission display panel (hereinafter referred to as "FED"), an organic or inorganic EL display panel, or a liquid crystal display panel.

For example, the PDP is structured such that a pair of front and back substrates are placed in parallel opposite to each other with a discharge space in between, and the periphery of the discharge space is sealed.

More specifically, a reflection-type AC PDP has a plurality of row electrode pairs formed on the inner surface of the front substrate for creation of a surface discharge (display discharge), and a dielectric layer covering the row electrode pairs. Further, on the inner surface of the back substrate facing the front substrate, a plurality of column electrodes are arranged in a direction at right angles to the row electrode pairs for creation of a selection discharge between the column electrode and one row electrode in each row electrode pair, and a column electrode protective layer covers the column electrodes. Between the front substrate and the back substrate, a partition wall is formed for partitioning the discharge space into discharge cells, and phosphor layers of the three primary colors (i.e. red, green and blue colors) are respectively formed in all the discharge cells such that the red, green and blue cells are arranged in order.

Figure 1:
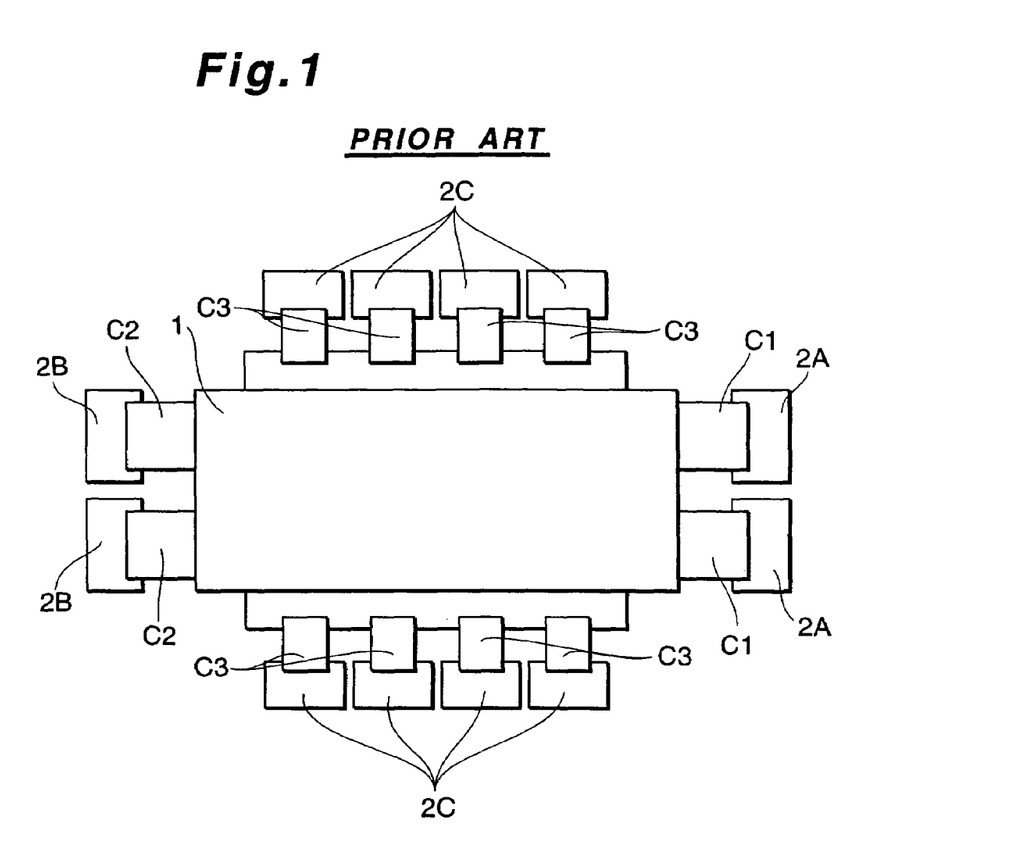
FIG. 1 is a plan view illustrating the structure of a conventional display apparatus.
Figure 2:
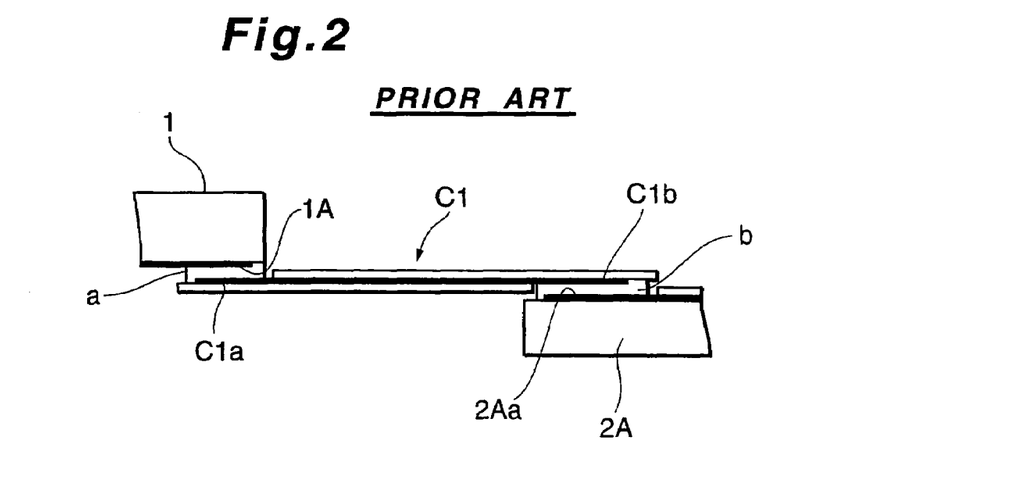
FIG. 2 is a sectional side view illustrating the structure of the electric connection between a display panel and a drive circuit board of the display apparatus.

FIG. 1 and FIG. 2 illustrate a conventional structure of electric connection between such a PDP and a driver board for driving the PDP in a display apparatus having the PDP.

FIG. 1 is a schematic plan view illustrating the relationship between the PDP and the drive circuit board. FIG. 2 is a sectional side view partially enlarged for illustration of the electric connection between the driver board and an electrode terminal extended from a row electrode of the PDP of the display apparatus.

In FIG. 1, one row electrode in each row electrode pair of the PDP 1 of the display apparatus is connected to a sustaining driver board 2A through an associated flexible cable C1. The other row electrode in each row electrode pair is connected to a scanning sustaining driver board 2B through an associated flexible cable C2.

Each of the column electrodes of the PDP 1 is connected to an addressing driver board 2C through an associated flexible cable C3.

FIG. 2 illustrates an electric connection between one row electrode in the row electrode pair and the sustaining driver board 2A through the flexible cable C1 as an example of the electric connection between the PDP 1 and each of the driver boards.

The following describes the electric connection between one row electrode in the row electrode pair of the PDP 1 and the sustaining driver board 2A by means of the flexible cable C1 on the basis of the structure in FIG. 2. However, the structure of the electric connection between the other row electrode in the row electrode pair and the scanning sustaining driver board 2B by means of the flexible cable C2 and the structure of the electric connection between the column electrode and the addressing driver board 2C by means of the flexible cable C3 are substantially the same as the structure illustrated in FIG. 2.

In FIG. 2, the electrode terminal 1A extended from one row electrode in the row electrode pair of the PDP 1 is coated with an anisotropic conductive adhesive a of a thermosetting property. One end C1$a$ of the flexible cable C1 is placed in a predetermined position to overlap the electrode terminal 1A and then thermo-compressively bonded to the electrode terminal 1A for the electric connection.

As in the above case, the electrode terminal 2A$a$ of the sustaining driver board 2A is coated with an anisotropic conductive adhesive b of a thermosetting property. The other end C1$b$ of the flexible cable C1 is placed in a predetermined position to overlap the electrode terminal 2A$a$ and then thermo-compressively bonded to the electrode terminal 2A$a$ for the electric connection.

Approximately the same structure as the aforementioned structure is used for the electric connection between any other flat display panel, such as an FED, an organic or inorganic EL display panel or a liquid crystal panel, and its driver board.

Such the foregoing conventional display apparatus is showed in JP Pat. Publication No. 2000-150033.

As described earlier, the thermo-compression bonding technique using an anisotropic conductive adhesive of a thermosetting property is used for the electric connection between the electrode terminal of the flat display panel and one end of the flexible cable and the electric connection between the other end of the flexible cable and the electrode terminal of the driver. This is because if the electric connection is implemented by using a connector, any foreign substance such as dust and the like may adhere to the inside of the connector during the manufacturing stage in a factory and may cause contact failure. Further the use of the thermo-compression bonding technique using the anisotropic conductive adhesive makes it possible to reduce the production costs of the display apparatus.

However, the conventional display apparatus structured as described above has some problems. For cases where a driver board connected to the flat display panel is faulty and needs replacement, the electric connection between the flexible cable and the driver board is made by means of the thermo-compression bonding technique using an anisotropic conductive adhesive, and the use of thermo-compression bonding technique makes the drive-board replacement difficult in the location of the display apparatus, such as a household. Therefore the display apparatus must be carried to a workshop for replacement work using specially designed equipment, which then requires enormous effort and greatly increases repair costs.

SUMMARY OF THE INVENTION

It is an object of the present invention to solve the problems associated with the conventional display apparatus as described above.

In other words, an object of the present invention is to facilitate the replacement of a driver board installed in a display apparatus.

To attain the above object, a first aspect of the present invention provides a display apparatus including a first connecting terminal provided in a first end portion of a connecting cable and electrically connected to an electrode terminal of a display panel through a conductive adhesive, and a second connecting terminal provided in a second end portion of the connecting cable and electrically connected to a terminal of a drive circuit board for the display panel through a conductive adhesive. The display apparatus has the advantage of a third connecting terminal provided in the second end portion of the connecting cable for establishing electric connection to a connector provided on a replacement drive circuit board.

The display apparatus according to the first aspect is shipped from a factory With each of the second connecting terminals of the connecting cables being electrically connected to the associated terminal of the drive circuit board for the display panel through the conductive adhesive. If the display apparatus suffers a breakdown in the site where the user has installed the display apparatus, such as a household, and needs replacement of the drive circuit board, the connection between the second terminal of the connecting cable and the terminal of the failed drive circuit board is cut off at site for repair.

The failed drive circuit board is replaced with a replacement drive circuit board. Then, the third connecting terminal provided in the connecting cable is coupled to a connector provided in the replacement drive circuit board for the electric connection to the replacement drive circuit board.

The foregoing display apparatus makes it possible to easily replace a drive circuit board with a replacement drive circuit board. Hence, the display apparatus according to the present invention is capable of saving time and efforts and the costs required in carrying the failed display apparatus to a workshop for replacement work using specially designed equipment as in conventional techniques.

To attain the aforementioned object, a second aspect of the present invention provides a connecting cable of a display apparatus which includes a first connecting terminal provided in a first end portion thereof and electrically connected to an electrode terminal of a display panel through a conductive adhesive, and the second connecting terminal provided in a second end portion thereof and electrically connected to a terminal of a drive circuit board for the display panel through the conductive adhesive, for the purpose of establishing electric connections between the display panel and the drive circuit board. The connecting cable has the advantage of a third connecting terminal provided in the second end portion for establishing electric connection to a connector provided in a replacement drive circuit board.

In the factory-shipped connecting cable in the display apparatus, each of the second connecting terminals is electrically connected to the associated terminal of the drive circuit board through the conductive adhesive. If the display apparatus suffers a breakdown in a site where the user has installed the display apparatus, such as a household, and needs replacement of the drive circuit board, the connection between the second connecting terminal of the connecting cable and the terminal of the broken-down drive circuit board is cut off at site for repair.

The broken-down drive circuit board is replaced with a replacement drive circuit board. Then, the third connecting terminal provided in the connecting cable is coupled to a connector provided in the replacement drive circuit board for an electric connection to the replacement drive circuit board.

The use of the foregoing connecting cable of the display apparatus for the connection between the display panel and the drive circuit board makes it possible to facilitate the replacement of a drive circuit board with a replacement drive circuit board. This easy replacement obviates the effort, time and costs required to carry the failed display apparatus to a workshop for replacement work using specially designed equipment as in conventional techniques.

These and other objects and features of the present invention will become more apparent from the following detailed description with reference to the accompanying drawings.

DETAILED DESCRIPTION OF THE PREFERRED EMBODIMENTS

Preferred embodiments according to the present invention will be described below in detail with reference to the accompanying drawings.

FIG. 3 to FIG. 6 illustrate a first embodiment of a display apparatus according to the present invention.

Figure 3:
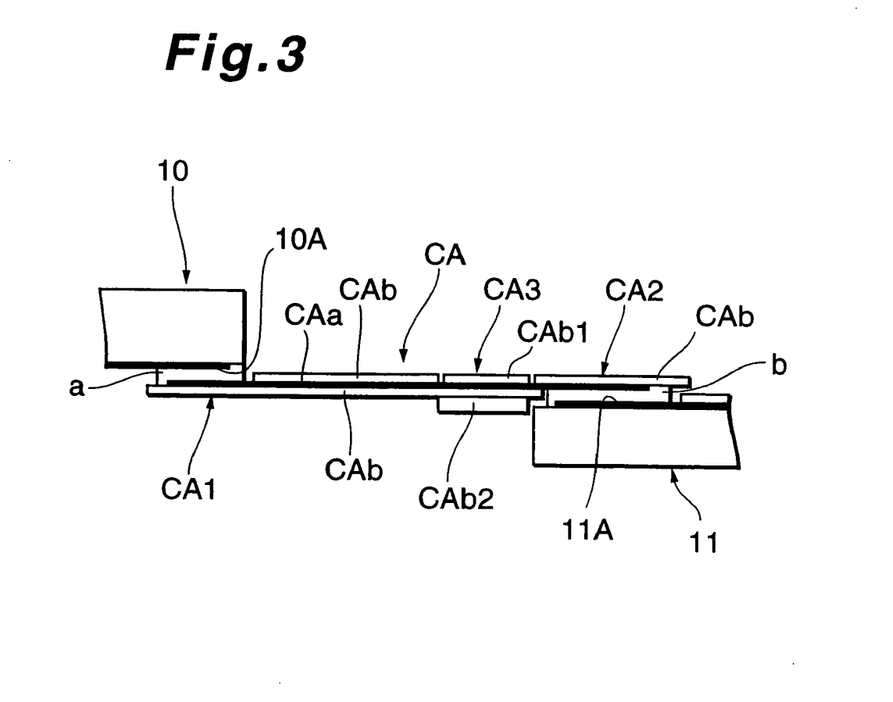
FIG. 3 is a sectional side view illustrating a first embodiment according to the present invention.
Figure 4:
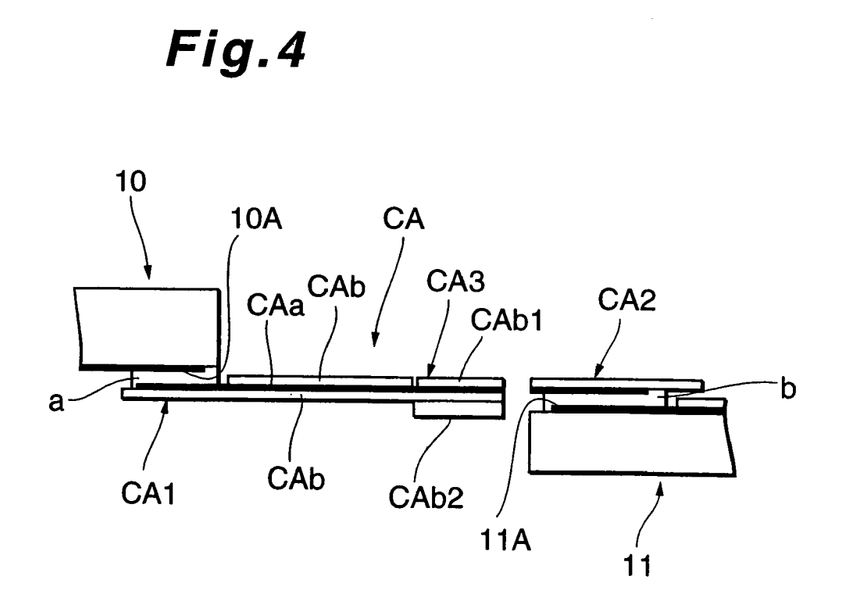
FIG. 4 is a sectional side view illustrating a flexible cable separated from a drive circuit board in the first embodiment.
Figure 5:
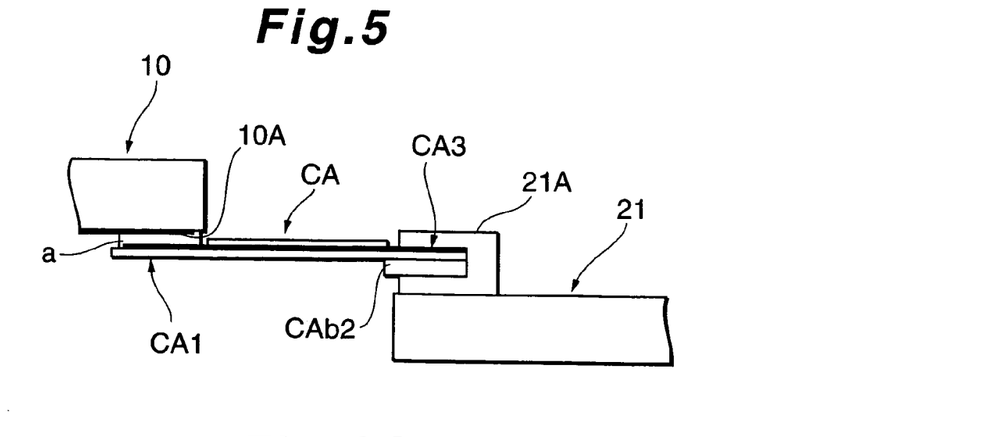
FIG. 5 is a sectional side view illustrating the flexible cable connected to a replacement drive circuit board in the first embodiment.
Figure 6A:
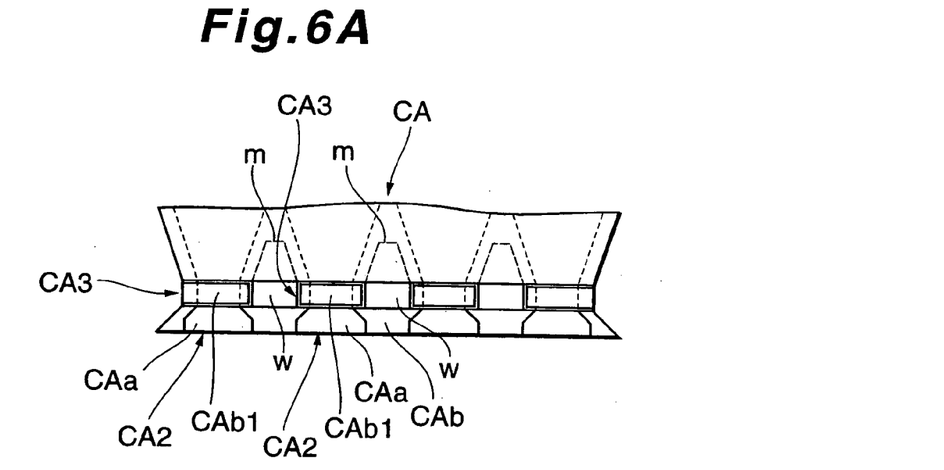
FIG. 6A is a plan view illustrating a second connecting terminal and a connector-coupling port in the flexible cable in the first embodiment.
Figure 6B:
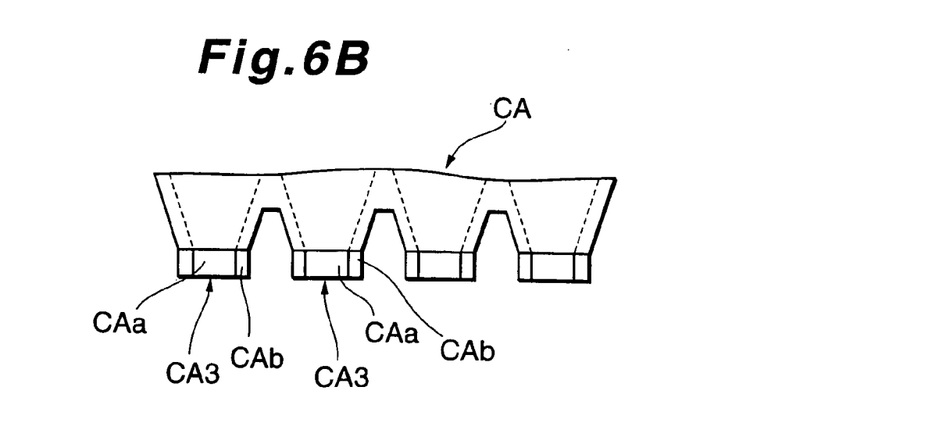
FIG. 6B is a plan view illustrating the flexible cable after the second connecting terminal is disconnected therefrom in the first embodiment.

FIG. 3 is a sectional side view illustrating the structure of the electric connection between a flat display panel and a drive circuit board in the display apparatus. FIG. 4 is a sectional side view illustrating electric disconnection between the flat display panel and the drive circuit board. FIG. 5 is a sectional side view illustrating an electric connection between the flat display panel and a replacement drive circuit board. FIGS. 6A and 6B respectively are plan views illustrating the structure of the connecting-to-drive-circuit-board part of the flexible cable establishing the electric connection between the flat display panel and the drive circuit board.

In FIG. 3, the flexible cable CA establishing electric connection between the flat display panel 10 and the drive circuit board 11 has one end connected to the flat display panel 10 at which a first connecting terminal CA1 is formed, and the other end connected to the drive circuit board 11 at which a second connecting terminal CA2 is formed. In the first connecting terminal CA1, part of a conductor CAa is exposed from an insulation coating CAb covering the conductor CAa. Similarly, in the second connecting terminal CA2, part of the conductor CAa is exposed from the insulation coating CAb covering the conductor CAa.

In a portion directly behind the second connecting terminal CA2, the insulation coating CAb is further removed to a required extent (the extent required for electrically connecting the flexible cable to the drive circuit board 11). In its place, an insulation sheet CAb1 is detachably affixed over the area from which the insulation layer CAb has been removed.

In the first embodiment, the face of the flexible cable CA on which the insulation sheet CAb1 is affixed is on the reverse side of the face on which the conductor CAa of the second connecting terminal CA2 has been exposed.

Further, a reinforcing plate CAb2 is secured to a portion of the insulation coating CAb (on the face on which the conductor CAa for the second connecting terminal CA2 has been exposed) directly opposite the insulation sheet CAb1.

The portion to which the insulation sheet CAb1 is affixed and the reinforcing plate CAb2 is also secured forms a connector-coupling port CA3.

In the production process, as shown in FIG. 3, the first connecting terminal CA1 is aligned on an electrode terminal 10A extended from the flat display panel 10 and thermo-compressively bonded to the electrode terminal 10A through an anisotropic conductive adhesive a of a thermosetting property for the electric connection between the flexible cable CA and the flat display panel 10.

Similarly, the second connecting terminal CA2 of the flexible cable CA is also aligned on an electrode terminal 11A extended from the drive circuit board 11 and thermo-compressively bonded to the electrode terminal 11A through an anisotropic conductive adhesive b of a thermosetting property for the electric connection between the flexible cable CA and the drive circuit board 11.

If the display apparatus produced as described above suffers a breakdown in, for example, a household where the user has installed the display apparatus, and needs replacement of the drive circuit board 11, the display apparatus is repaired as follows: the flexible cable CA is cut between the second connecting terminal CA2 and the connector-coupling port CA3 and separated from the failed drive circuit board 11 as illustrated in FIG. 4.

After that, the failed drive circuit board 11 is removed. Then as shown in FIG. 5 a replacement drive circuit board 21 is substituted for the failed drive circuit board 11 and mounted in the display apparatus.

The replacement drive circuit board 21 has the same function as that of the drive circuit board 11, and has a connector 21A, taking the place of the electrode terminal 11A, mounted for coupling to the connector-coupling port CA3 of the flexible cable CA, as will be described later.

After completion of the attachment of the replacement drive circuit board 21, the insulation sheet CAb1 of the connector-coupling port CA3 provided at the cut-off end of the flexible cable CA is removed to expose the corresponding part of the conductor CAa.

Then, the connector-coupling port CA3 with the exposed conductor CAa and the reinforcing plate CAb2 is inserted into the connector 21A of the replacement drive circuit board 21 to establish electric connection to the replacement drive circuit board 21.

At this point, the reinforcing plate CAb2 prevents the connector-coupling port CA3 from bending, so as to facilitate connection to the connector 21A of the replacement drive circuit board 21.

With the display apparatus, the second connecting terminal CA2 of the flexible cable CA which is thermo-compressively bonded to the failed drive circuit board 11 is cut off from the flexible cable CA. Then the connector-coupling port CA3 provided at the cut end of the remaining flexible cable CA is coupled to the connector 21A of the replacement drive circuit board 21 taking the place of the failed board 11. Thus, it is possible to easily replace the drive circuit board 11 with the replacement drive circuit board 21, and therefore to obviate the time and effort and the costs for carrying the display apparatus to a workshop for replacement work using specially designed equipment when the drive circuit board 11 of the display apparatus suffers a breakdown.

FIGS. 6A and 6B illustrate the structure of the end portion of the flexible cable CA at which the second connecting terminals CA2 and the connector-coupling ports CA3 are provided. FIG. 6A is a plan view illustrating the factory-shipped coupling between the second terminals CA2 and the connector-coupling ports CA3. FIG. 6B is a plan view illustrating the connector-coupling ports CA3 from which the second connecting terminals CA2 are cut off when repairs are made to the drive circuit board.

Referring to FIG. 6A, the end portion of the flexible cable CA connected to the drive circuit board 11 is formed in a flat plate shape. The ends of a plurality of conductors CAa arranged so as to extend in parallel to each other are exposed at regular intervals on the flat-plate-shaped end portion of the flexible cable CA, so that a plurality of second connecting terminals CA2 are regularly arranged along the end of the flexible cable CA.

A band-shaped part directly behind (in the upper side in FIG. 6A) the part of the flexible cable CA in which the second connecting terminals CA2 are provided extends in a direction at right angles to the conductor CAa (in the right-left direction in FIG. 6A). Between the two conductors CAa in this band-shaped part, a quadrangular window w is opened passing through the flexible cable CA from face to face. A part of the insulation coating CAb corresponding to a part of the conductor CAa between the two windows w is removed. In place of this, the insulation sheet CAb1 is detachably attached to cover the exposed part of the conductor CAa.

The reinforcing plate not shown in FIG. 6A is secured on the reverse of the flexible cable CA from the insulation sheet CAb1 attached to the flexible cable CA to form the connector-coupling port CA3.

Further, a set of tear-off perforations (or possibly a slit) m is formed in a trapezoidal shape, having its base on the inner side (upper side in FIG. 6A) of the window w, in an area of the insulation coating CAb corresponding to the part between the two conductors CAa which is directly behind each connector-coupling port CA3 of the flexible cable CA.

As described in FIG. 3, in the flexible cable CA in FIG. 6A, each of the second connecting terminals CA2 provided at the leading end of the flexible cable CA is thermo-compressively bonded to the electrode terminal 11A of the drive circuit board 11 by use of the anisotropic conductive adhesive b of a thermosetting property for the electric connection before the display apparatus is shipped from the factory.

When repairs are made to the drive circuit board 11, as shown in FIG. 6B, the part between the second connecting terminal CA2 and the connector-coupling port CA3 is cut to separate the second connecting terminals CA2 from the leading end of the flexible cable CA (see FIG. 4).

At this point, the perforations m are also cut so that the trapezoidal shaped part of the insulation coating CAb surrounded by the perforations m is cut away.

In this way, an arm portion supporting each of the connector-coupling ports CA3 is allowed to move independently of the right and left connector-coupling ports CA3 adjacent thereto.

Then, the insulation sheet CAb1 of each of the connector-coupling ports CA3 is peeled off and the leading end of the conductor CAa in the connector-coupling port CA3 is coupled to the corresponding connector provided in the replacement drive circuit board for electric connection as described in FIG. 5.

Figure 7:
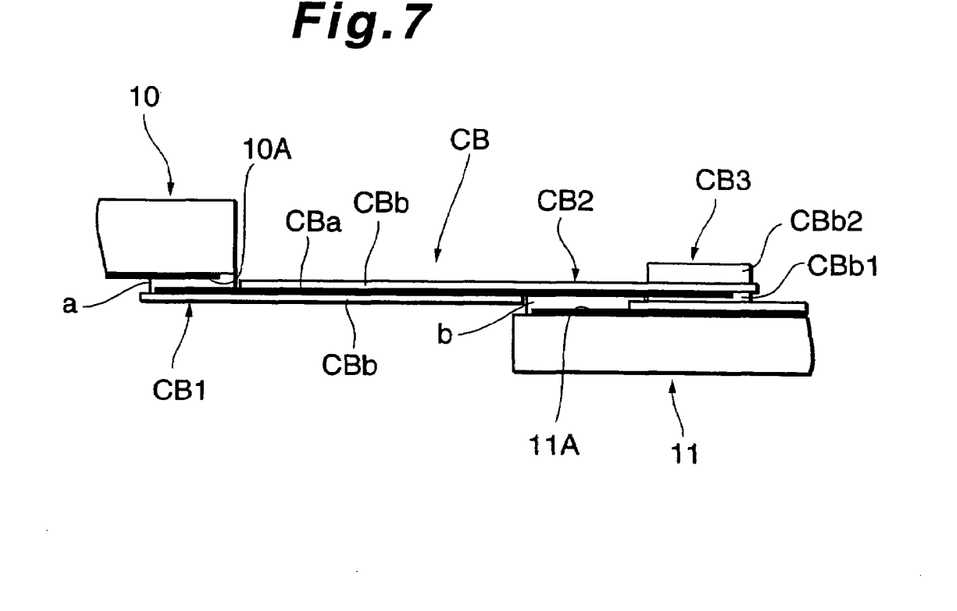
FIG. 7 is a sectional side view illustrating a second embodiment according to the present invention.
Figure 8:
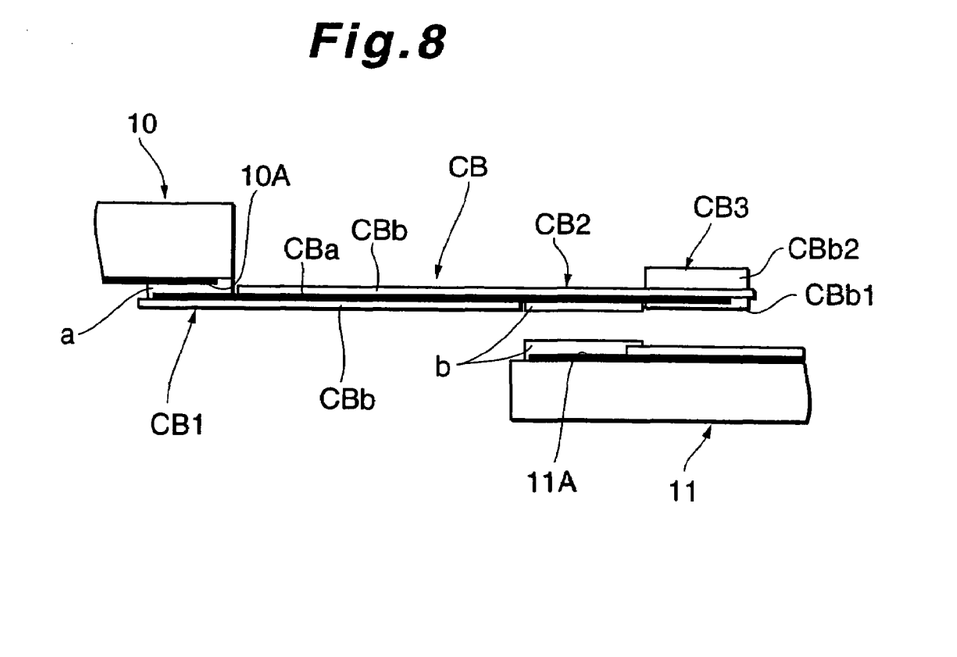
FIG. 8 is a sectional side view illustrating a flexible cable disconnected from a drive circuit board in the second embodiment.
Figure 9:
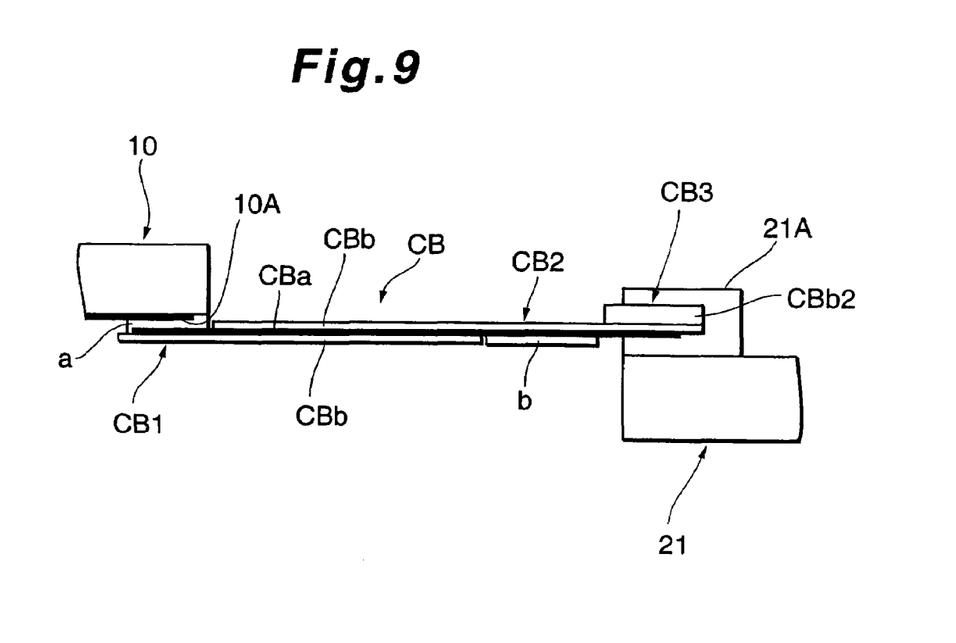
FIG. 9 is a sectional side view illustrating the flexible cable connected to a replacement drive circuit board in the second embodiment.

FIG. 7 to FIG. 9 illustrate a second embodiment of the display apparatus according to the present invention.

FIG. 7 is a sectional side view illustrating the structure of the electric connection between a flat display panel and a drive circuit board in the display apparatus. FIG. 8 is a sectional side view illustrating an electrical disconnection between the flat display panel and the drive circuit board. FIG. 9 is a sectional side view illustrating the structure of the electric connection between the flat display panel and a replacement drive circuit board.

Referring to FIG. 7, a flexible cable CB is provided for establishing the electric connection between the flat display panel 10 and the drive circuit board 11. A first connecting terminal CB1 is formed in an end portion of the flexible cable CB connected to the flat display panel 10. In the first connecting terminal CB1, part of a conductor CBa is exposed from an insulation coating CBb covering the conductor CBa. Similarly, a second connecting terminal CB2 having part of the conductor CBa exposed from the insulation coating CBb is formed in the end portion of the flexible cable CB connected to the drive circuit board 11, and is located at a predetermined distance from the outmost end of the end portion in the direction of the flat display panel 10.

The insulation coating CBb is removed over an area from the second connecting terminal CB2 to the outmost end of the flexible cable CB. An insulation sheet CBb1 is detachably affixed in place of the removed part of the insulation coating CBb.

In the second embodiment, the portion of the connecting cable CB on which the insulation sheet CBb1 is affixed and the portion of the second connecting terminal CB2 in which the conductor CBa is exposed are formed on the same face.

A reinforcing plate CBb2 is secured on the insulation coating CBb on the reverse side from the side on which the insulation sheet CBb1 is affixed (i.e. from the side on which the conductor CBa in the second connecting terminal CB2 is exposed).

The portion of the flexible cable CB to which the insulation sheet CBb1 is affixed and the reinforcing plate CBb2 is secured constitutes a connector-coupling port CB3.

In the production process, as shown in FIG. 7, the first connecting terminal CB1 of the flexible cable CB is aligned on an electrode terminal 10A extended from the flat display panel 10 and thermo-compressively bonded to the electrode terminal 10A through an anisotropic conductive adhesive a of a thermosetting property for the electric connection between the flexible cable CB and the flat display panel 10.

Likewise, the second connecting terminal CB2 of the flexible cable CB is also aligned on an electrode terminal 11A extended from the drive circuit board 11 and thermo-compressively bonded to the electrode terminal 11A through an anisotropic conductive adhesive b of a thermosetting property for the electric connection between the flexible cable CB and the drive circuit board 11.

Here, in contrast to the case of the display panel in the first embodiment, the connector-coupling port CB3 is sited closer to the leading end of the flexible cable CB than the second connecting terminal CB2 is. Therefore, the connector-coupling port CB3 is opposite the inner surface of the drive circuit board 11 with the reinforcing plate CBb2 facing inward, when viewed with respect of the connecting cable CB.

If the display apparatus produced as described above suffers a breakdown in, for example, a household where the user has installed the display apparatus, and needs replacement of the drive circuit board 11, the display apparatus is repaired in the following way. As shown in FIG. 8, the anisotropic conductive adhesive b of a thermosetting property through which the second connecting terminal CB2 of the flexible cable CB and the electrode terminal 11A of the drive circuit board 11 are thermo-compressively bonded to each other is cut in parallel with the surface of the electrode terminal 11A of the drive circuit board 11 to separate the flexible cable CB from the failed drive circuit board 11.

After that, the failed drive circuit board 11 is removed, and then as shown in FIG. 9 a replacement drive circuit board 21 is substituted for the failed drive circuit board 11 and mounted in the display apparatus.

As described in the first embodiment, the replacement drive circuit board 21 has the same function as that of the drive circuit board 11, and has a connector 21A, taking the place of the electrode terminal 11A, connectable to the connector-coupling port CB3 of the flexible cable CB.

After completion of the mounting of the replacement drive circuit board 21, the insulation sheet CBb1 of the connector-coupling port CB3 located at the leading end of the flexible cable CB is peeled off to expose the corresponding part of the conductor CBa.

Then, the connector-coupling port CB3 with the exposed conductor CBa and the reinforcing plate CBb2 is inserted into the connector 21A of the replacement drive circuit board 21 to establish an electric connection to the replacement drive circuit board 21.

At this point, the reinforcing plate CBb2 prevents the connector-coupling port CB3 from bending, so as to facilitate connection to the connector 21A of the replacement drive circuit board 21.

With the display apparatus, by means of cutting the thermo-compressive bonding part between the failed drive circuit board 11 and the second connecting terminal CB2 of the flexible cable CB, and then coupling the connector-coupling port CB3, provided at the leading end of the flexible cable CB, to the connector 21A of the replacement drive circuit board 21 taking the place of the failed board 11, the easy replacement of the drive circuit board 11 with the replacement drive circuit board 21 is achieved. Therefore, when the drive circuit board 11 of the display apparatus suffers a breakdown, it is possible to obviate the conventional time, effort and costs for carrying the display apparatus to a workshop for replacement work using specially designed equipment.

As distinct from the first embodiment, in the case of the display apparatus in the second embodiment, after the failed circuit board 11 is cut away from the flexible cable CB, the second connecting terminal CB2 still remains attached to the flexible cable CB. Hence, it is possible to thermo-compressively re-bond the remaining second connecting terminal CB2 to the replacement spare drive circuit board through an anisotropic conductive adhesive of a thermosetting property for the electric connection.

Figure 10:
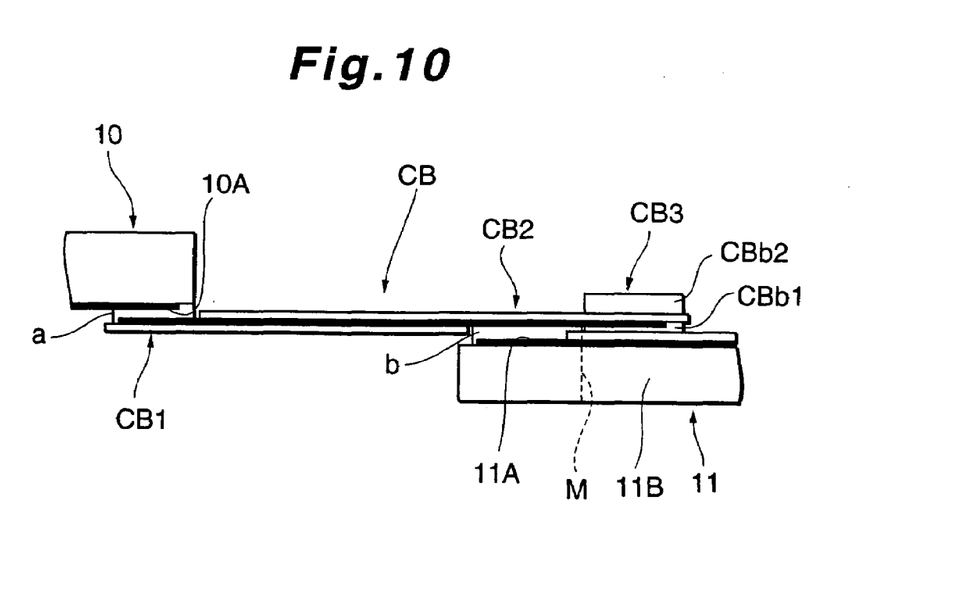
FIG. 10 is a sectional side view illustrating a third embodiment according to the present invention.
Figure 11:
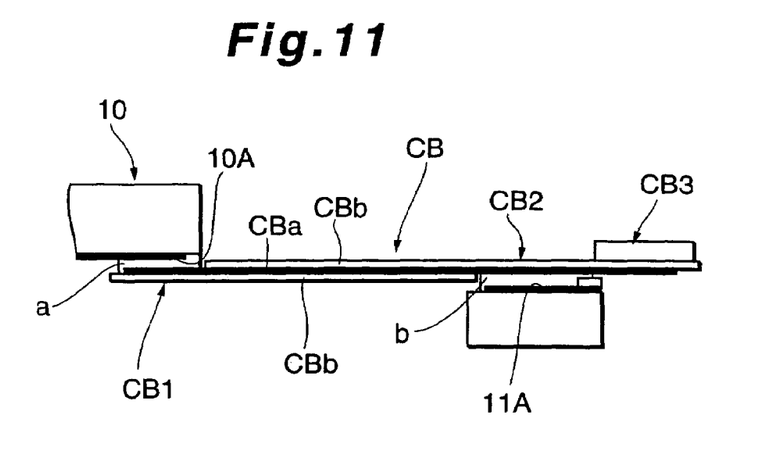
FIG. 11 is a sectional side view illustrating a flexible cable disconnected from a drive circuit board in the third embodiment.

FIGS. 10 and 11 illustrate a third embodiment of the display apparatus according to the present invention.

FIG. 10 is a sectional side view illustrating the structure of an electric connection part between the flat display panel and the drive circuit board for the display apparatus. FIG. 11 is a sectional side view illustrating electric disconnection between the flat display panel and the drive circuit board.

The structure of the flexible cable CB of the display apparatus in the third embodiment is the same as that in the second embodiment.

As shown in FIG. 10, the display apparatus in the third embodiment has a set of tear-off perforations (or possibly a slit) M formed between an electrode terminal 11A and a board body 11B of the drive circuit board 11. When replacing the drive circuit board 11, as shown in FIG. 11, the electrode terminal 11A is detached from the board body 11B along the perforations (or slit) M of the drive circuit board 11, so that the flexible cable CB with the electrode terminal 11A is separated from the drive circuit board 11.

Then, the electrode terminal 11A is removed from, or alternatively remains as it is at the second connecting terminal CB2 of the flexible cable CB. Then, as in the case of FIG. 9 described in the second embodiment, the connector-coupling port CB3 is connected to the connector of the replacement drive circuit board.

When the display apparatus in the third embodiment uses the flexible cable CB having the connector-coupling port CB3 provided on the outward side of the second connecting terminal CB2, it is possible in repairing the drive circuit board 11 to easily disconnect the failed drive circuit board 11 from the second connecting terminal CB2 of the flexible cable CB.

A generic concept of the display panel in the aforementioned embodiments is a display panel which includes: a first connecting terminal provided in a first end portion of a connecting cable and electrically connected to an electrode terminal of a display panel through a conductive adhesive; a second connecting terminal provided in a second end portion of the connecting cable and electrically connected to a terminal of a drive circuit board for the display panel through a conductive adhesive; and a third connecting terminal provided in the second end portion of the connecting cable for establishing electric connection to a connector provided on a replacement drive circuit board.

Before the display apparatus in the generic concept is shipped from a factory, each of the second connecting terminals of the connecting cables is electrically connected to the associated terminal of the drive circuit board for the display panel through the conductive adhesive. If the display apparatus suffers a breakdown in the site where the user has installed the display apparatus, such as a household, and needs replacement of the drive circuit board, the connection between the second connecting terminal of the connecting cable and the terminal of the broken-down drive circuit board is cut off at site for repair.

After the failed drive circuit board is replaced with a replacement drive circuit board, the third connecting terminal provided in the connecting cable is coupled to a connector provided in the replacement drive circuit board for electric connection to the spare drive circuit board.

With the foregoing display apparatus, easy replacement of a drive circuit board with a replacement drive circuit board is permitted. Hence, the display apparatus according to the present invention makes it possible to save the time, effort and costs required to conventionally carry the failed display apparatus to a workshop for replacement work using specially designed equipment.

A generic concept of the connecting cable (i.e. flexible cable) used in the display apparatus in each of the embodiments is a connecting cable which has a first connecting terminal provided in a first end portion thereof and electrically connected to an electrode terminal of a display panel through a conductive adhesive, and a second connecting terminal provided in a second end portion thereof and electrically connected to a terminal of a drive circuit board for the display panel through a conductive adhesive, for the purpose of establishing electric connections between the display panel and the drive circuit board, and further has a third connecting terminal provided in the second end portion for establishing electric connection to a connector provided in a replacement drive circuit board.

In the factory-shipped connecting cable of the display apparatus in the generic concept, the second connecting terminal is electrically connected to the terminal of the drive circuit board for the display panel through the conductive adhesive. If the display apparatus suffers a breakdown requiring the replacement of a drive circuit board in the site where the user has installed the display apparatus, such as a household, the connection between the second connecting terminal of the connecting cable and the terminal of the breakdown drive circuit board is cut off for repair on site.

After the failed drive circuit board is replaced with the replacement drive circuit board, the third connecting terminal provided in the connecting cable is coupled to a connector provided in the replacement drive circuit board for electric connection to the spare drive circuit board.

The use of the connecting cable for the display apparatus to establish a connection between the display panel and the drive circuit board makes it possible to facilitate the replacement of a drive circuit board with a replacement drive circuit board. Hence, due to this easy replacement, it is possible to save the time, effort and costs required to conventionally carry the failed display apparatus to a workshop for replacement work using specially designed equipment.

The terms and description used herein are set forth by way of illustration only and are not meant as limitations. Those skilled in the art will recognize that numerous variations are possible within the spirit and scope of the invention as defined in the following claims.

What is claimed is:

1. A display apparatus including a first connecting terminal provided in a first end portion of a connecting cable and electrically connected to an electrode terminal of a display panel through a conductive adhesive, and a second connecting terminal provided in a second end portion of the connecting cable and electrically connected to a terminal of a drive circuit board for the display panel through the conductive adhesive, said display apparatus comprising:

a third connecting terminal provided in the second end portion of the connecting cable for establishing electric connection to a connector provided on a replacement drive circuit board, wherein said third connecting terminal is insertable into the connector on the replacement drive circuit board, wherein said third connecting terminal comprises a connector-coupling terminal to be coupled to the connector on the replacement drive circuit board by means of insertion, wherein the connecting cable comprises a conductor having two faces covered with an insulation coating, and said connector-coupling terminal is formed by exposing a part of the conductor from one face of the connecting cable and mounting a reinforcing plate on the other face of the connecting cable, and wherein the part of the conductor exposed in said connector-coupling terminal is covered with a detachable insulation sheet.

2. A display apparatus according to claim 1, wherein said third connecting terminal is provided on an inward side of the second connecting terminal in the second end portion of the connecting cable.

3. A display apparatus according to claim 1, wherein said third connecting terminals are arranged in parallel in plural in individual correspondence with a plurality of the second connecting terminals lined up in the second end portion of the connecting cable.

4. A display apparatus according to claim 3, wherein the adjacent third connecting terminals of the plurality of said third connecting terminals arranged in parallel are separable and detachable from each other.

5. A connecting cable of a display apparatus including a first connecting terminal provided in a first end portion of the connecting cable and electrically connected to an electrode terminal of a display panel through a conductive adhesive, and a second connecting terminal provided in a second end portion of the connecting cable and electrically connected to a terminal of a drive circuit board for the display panel through the conductive adhesive, for the purpose of establishing electric connection between the display panel and the drive circuit board, said connecting cable of the display apparatus comprising:

a third connecting terminal provided in the second end portion for establishing electric connection to a connector provided in a replacement drive circuit board, wherein said third connecting terminal is insertable into the connector on the replacement drive circuit board, wherein said third connecting terminal comprises a connector-coupling terminal to be coupled to the connector on the replacement drive circuit board by means of insertion, wherein the connecting cable comprises a conductor having two faces covered with an insulation coating, and said connector-coupling terminal is formed by exposing a part of the conductor from one face of the connecting cable and mounting a reinforce plate on the other face of the connecting cable, and wherein the part of the conductor exposed in said connector-coupling terminal is covered with a detachable insulation sheet.

6. A connecting cable of a display apparatus according to claim 5, wherein said third connecting terminal is provided on an inward side of the second connecting terminal in the second end portion of the connecting cable.

7. A connecting cable of a display apparatus according to claim 5, wherein said third connecting terminals are arranged in parallel in plural in individual correspondence with a plurality of the second connecting terminals lined up in the second end portion of the connecting cable.

8. A connecting cable of a display apparatus according to claim 7, wherein the adjacent third connecting terminals of the plurality of said third connecting terminals arranged in parallel are separable and detachable from each other.

* * * * *